(12) United States Patent
Park

(10) Patent No.: US 9,530,557 B2
(45) Date of Patent: Dec. 27, 2016

(54) WORKING MACHINE POWERED IN A NON-CONTACT MANNER

(71) Applicant: HANWHA TECHWIN CO., LTD., Changwon-Si (KR)

(72) Inventor: Kyung-Sung Park, Fukuoka (JP)

(73) Assignee: Hanwha Techwin Co., Ltd., Changwon (KR)

( * ) Notice: Subject to any disclaimer, the term of this patent is extended or adjusted under 35 U.S.C. 154(b) by 536 days.

(21) Appl. No.: 13/891,292

(22) Filed: May 10, 2013

(65) Prior Publication Data

US 2013/0340247 A1 Dec. 26, 2013

(30) Foreign Application Priority Data

Jun. 21, 2012 (JP) .................................. 2012-140139
Oct. 4, 2012 (KR) ........................ 10-2012-0110091

(51) Int. Cl.
*B23P 19/00* (2006.01)
*H05K 13/04* (2006.01)
*H01F 38/14* (2006.01)

(52) U.S. Cl.
CPC .............. *H01F 38/14* (2013.01); *H05K 13/04* (2013.01); *H05K 13/0413* (2013.01); *Y10T 29/53174* (2015.01)

(58) Field of Classification Search
CPC .......... H02J 5/005; H02J 7/025; H02J 7/0027; H01F 38/14; H05K 13/04; H05K 13/0413; Y10T 29/53039; Y10T 29/53061; Y10T 29/53083; Y10T 29/5313; Y10T 29/53174; Y10T 29/53196; Y10T 29/53261

USPC .......... 29/709, 714, 719, 729, 744, 759, 739
See application file for complete search history.

(56) References Cited

U.S. PATENT DOCUMENTS

| | | | |
|---|---|---|---|
| 5,203,061 A | 4/1993 | Hamada | |
| 9,000,723 B2* | 4/2015 | Park et al. | 320/109 |
| 9,120,383 B2 | 9/2015 | Jindo et al. | |
| 9,172,436 B2* | 10/2015 | Miyauchi | H04B 5/0093 |
| 2012/0293007 A1* | 11/2012 | Byun | H02J 17/00 307/104 |
| 2014/0232201 A1* | 8/2014 | Staring | 307/104 |
| 2014/0339913 A1* | 11/2014 | Tsuji et al. | 307/104 |

FOREIGN PATENT DOCUMENTS

| | | |
|---|---|---|
| JP | 4261722 A | 9/1992 |
| JP | 20046605 A | 1/2004 |
| JP | 2005210078 A | 8/2005 |
| JP | 2006173442 A | 6/2006 |

(Continued)

OTHER PUBLICATIONS

Communication issued on May 24, 2016, issued by the Japanese Intellectual Property Office in counterpart Japanese Application No. 2012-140139.

*Primary Examiner* — Paul D Kim
(74) *Attorney, Agent, or Firm* — Sughrue Mion, PLLC

(57) ABSTRACT

There is provided a working machine including a guide beam having a power transmitter; at least one working head comprising a power receiver and configured to move along the guide beam, wherein the power receiver receives power from the power transmitter in a non-contact manner in which the power receiver and the power transmitter are not physically connected, and wherein the working head operates by the received power in the non-contact manner.

15 Claims, 4 Drawing Sheets

(56) References Cited

FOREIGN PATENT DOCUMENTS

| | | | |
|---|---|---|---|
| JP | 2008243839 | A | 10/2008 |
| JP | 2012110118 | A | 6/2012 |
| KR | 100915662 | B1 | 9/2009 |
| KR | 1020100085681 | A | 7/2010 |

* cited by examiner

WORKING MACHINE POWERED IN A NON-CONTACT MANNER

CROSS-REFERENCE TO RELATED PATENT APPLICATIONS

This application claims priority from Japanese Patent Application No. 2012-140139, filed on Jun. 21, 2012, in the Japanese Patent Office, and Korean Patent Application No. 10-2012-0110091, filed on Oct. 4, 2012, in the Korean Intellectual Property Office, the disclosures of which are incorporated herein by reference in their entireties.

BACKGROUND

1. Field

Apparatuses consistent with exemplary embodiments relate to a working machine including a working head moving along a guide beam.

2. Description of the Related Art

An electronic component mounting apparatus for mounting an electronic component, such as an integrated circuit (IC) chip, on a printed circuit board is an example of a working machine that includes a working head moving along a guide beam. FIG. 1 illustrates an electronic component mounting apparatus of the related art which includes a mounting head 100 as a working head, where the mounting head 100 includes a nozzle. The mounting head 100 is movable in an X-direction along a guide beam, referred to as an X-direction beam 200. The X-direction beam 200 straddles over a pair of Y-direction beams 300 that are spaced apart from each other in the X-direction and the X-direction beam is installed on the Y-direction beams 300. The X-direction beam is movable in the Y-direction along the Y-direction beams 300. As such, the mounting head 100 may freely move in the X-direction and the Y-direction within a horizontal plane according to a combination of the X-direction beam 200 and the Y-direction beam 300. According to a combined movement in the X-direction and the Y-direction, the mounting head 100 moves to a component supply unit (not shown), picks up an electronic component from the component supply unit by using a nozzle, moves to a predetermined mounting location of a printed circuit board (not shown), and then mounts the electronic component at the predetermined mounting location of the printed board.

In order to drive the electronic component mounting apparatus, power needs to be supplied to the mounting head 100 or the like. In the related art, for example, in Japanese Patent Publication JP 2008-243839, power is supplied to the mounting head 100 from an external power source by using a cable, and a Cableveyor™ 210 is used to move a direct power feeder, such as a cable or a slip ring, within range of the mounting head 100 in the X-direction.

However, abrasion or disconnection is not completely prevented by using such a power supply method, and when the Cableveyor™ is installed to provide power to a mounting head 100, operational range of the mounting head in an X-Y direction is limited. Thus, even when a plurality of mounting heads are mounted on one X-direction beam to improve mounting efficiency, operational range of each mounting head is not sufficiently obtained, and it is difficult in practice to install the plurality of mounting heads on one X-direction beam.

Such power supply problems are not limited to the electronic component mounting apparatus and are common to a working machine that includes a working head moving along a guide beam.

SUMMARY

One or more exemplary embodiments provide a working machine powered in a non-contact manner including a working head moving along a guide beam, wherein power is supplied to the working head without using a direct power feeder.

According to an aspect of an exemplary embodiment, there is provided a working machine including a guide beam including a power transmitter; at least one working head comprising a power receiver which moves along the guide beam, wherein the power receiver receives power from the power transmitter in a non-contact manner in which the power receiver and the power transmitter are not physically connected, and wherein the working head operates by the received power in the non-contact manner.

The working head may move in a direction along an extension direction of the guide beam and maintains a uniform distance from the guide beam in a direction perpendicular from the extension direction.

The non-contact manner includes electric field coupling, wherein the power transmitter comprises a power transmitter electrode, and wherein the power receiver comprises a power receiver electrode facing the power transmitter electrode. The power receiver electrode maintains a uniform distance from the power transmitter electrode in a direction perpendicular to an extension direction of the guide beam.

The non-contact manner may include electromagnetic induction, wherein the power transmitter comprises a power transmitter coil, and wherein the power receiver comprises a power reception coil facing the power transmitter coil.

The power reception coil may maintain a uniform distance from the power transmitter coil in a direction perpendicular to an extension direction of the guide beam.

The at least one working head may include a plurality of the working heads which move along the same guide beam.

The working head may include a wireless communication unit configured to receive a control signal to operate the working head, and at least one pressure generating unit.

According to an aspect of another exemplary embodiment, there is provided a working machine including a power transmitter disposed on a guide beam; a power receiver disposed on a working head, wherein the working head moves along the guide beam maintaining a uniform distance between the power transmitter and the power receiver, wherein the power transmitter transmits power to the power receiver wirelessly, and the working head operates by the transmitted power.

According to an aspect of another exemplary embodiment, there is provided a component moving apparatus including: a guide beam comprising a power transmitter; at least one working head comprising a power receiver and configured to move along the guide beam; wherein the power receiver receives power from the power transmitter in a non-contact manner in which the power receiver and the power transmitter are not physically connected, and wherein the working head operates by the received power in the non-contact manner.

BRIEF DESCRIPTION OF THE DRAWINGS

The above and/or other aspects will become more apparent by describing in detail exemplary embodiments thereof with reference to the attached drawings in which.

DETAILED DESCRIPTION

Figure 1:
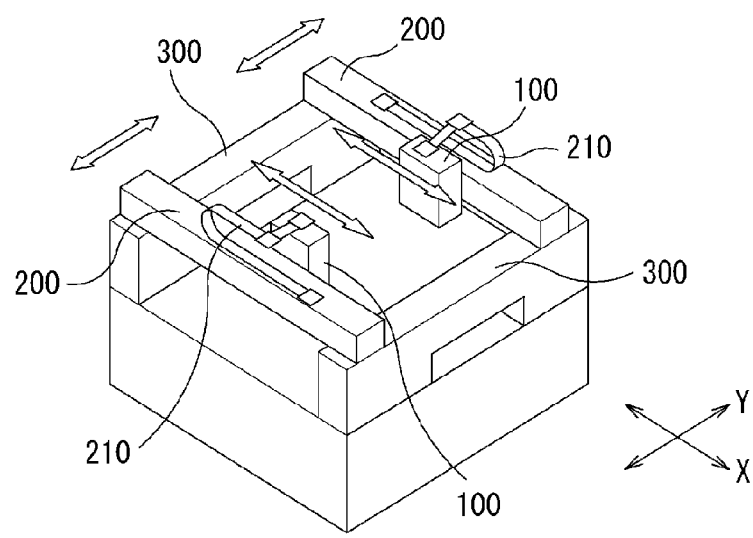
FIG. 1 is a diagram illustrating a structure of a electronic component mounting apparatus of the related art.

Hereinafter, one or more embodiments will be described in detail with reference to accompanying drawings. Also, in drawings, same reference numerals denote same elements to avoid repetition. An example of a working machine according to an exemplary embodiment will now be described, specifically, an electronic component mounting apparatus.

Figure 2:
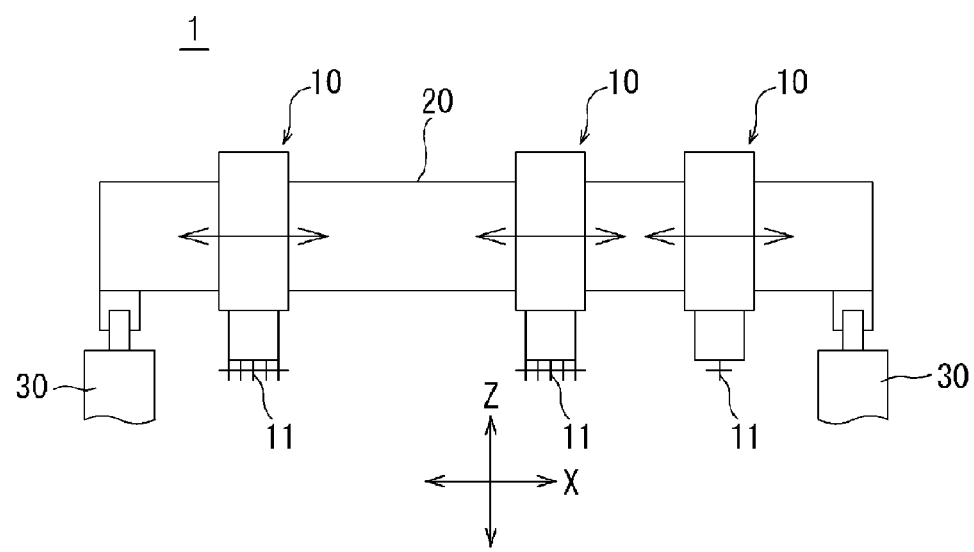
FIG. 2 is a diagram illustrating a basic structure of an electronic component mounting apparatus in a view along a Y-direction according to an exemplary embodiment.

FIG. 2 is a diagram illustrating a basic structure of an electronic component mounting apparatus 1 according to an exemplary embodiment. The electronic component mounting apparatus 1 includes a mounting head 10 as a working head. The mounting head 10 picks up an electronic component and mounts the electronic component onto a printed circuit board. One or more nozzles 11 are installed onto the mounting head 10 and are movable in a Z-direction crossing X- and Y-directions, i.e., in an up-and-down direction as shown in FIG. 2.

Referring to the electronic component mounting apparatus 1 of FIG. 2, three mounting heads 10 are installed to an X-direction beam 20 and are movable in an X-direction along the X-direction beam 20. Each of the three mounting heads 10 may be a rotary type or linear type inclusive of a plurality of nozzles, a type including one nozzle, or a combination of a plurality of mounting head types. Each of the three mounting heads 10 may be of the same or different type and may move freely according to an optimized program while avoiding collision and interference from one another. The X-direction beam 20 is an example of a guide beam according to an exemplary embodiment.

In FIG. 2, only one X-direction beam 20 is shown, but alternatively, a pair of the X-direction beams 20 may straddle over the Y-direction beams 30 as shown in FIG. 1, and one or more mounting heads 10 may be installed to one of the X-direction beams 20.

The X-direction beam 20 straddles over a pair of Y-direction beams 30 that are spaced apart from each other in the X-direction and the X-direction beam 20 is installed on the Y-direction beams 30. The X-direction beam is movable in the Y-direction along the Y-direction beams 30. As such, one or more of the three mounting heads 10 freely moves in the X-direction and the Y-direction within a horizontal plane according to a combination of the X-direction beam 20 and the Y-direction beam 30. According to a combined movement in the X-direction and the Y-direction, one or more of the three mounting heads 10 moves to a component supply unit (not shown), picks up an electronic component by using a nozzle 11, moves to a predetermined mounting location of a printed circuit board (not shown), and then mounts the electronic component at the predetermined mounting location of the printed circuit board.

Figure 3:
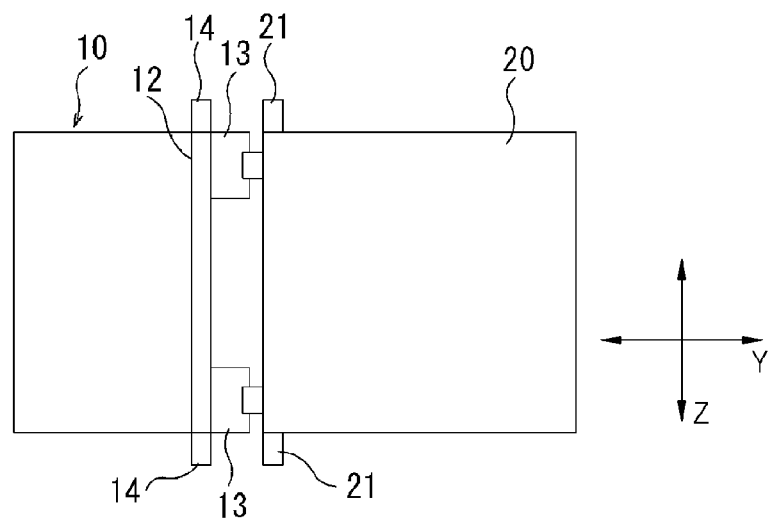
FIG. 3 is a side view along an X-direction illustrating a structure for supplying power to a mounting head in the electronic component mounting apparatus of FIG. 2 according to an exemplary embodiment.

FIG. 3 is a diagram illustrating a structure for supplying power to the mounting head 10 according to an exemplary embodiment. As shown in FIG. 3, the mounting head 10 is installed to the X-direction beam 20 along a length direction (X-direction) of the X-direction beam 20 by using a linear guide 13 installed to a board plate 12, and is movable in the X-direction. In other words, the mounting head 10 freely moves in the X-direction while maintaining a uniform distance from the X-direction beam 20.

In FIG. 3, electric field coupling is used to supply power to the mounting head 10. According to the electric field coupling, power is transmitted in a non-contact (wireless) manner by using an electric field generated when a power transmitter electrode and a power receiver electrode approach each other, wherein the power transmitter electrode is installed to a power transmission side and the power receiver electrode is installed to a power reception side.

Figure 4:
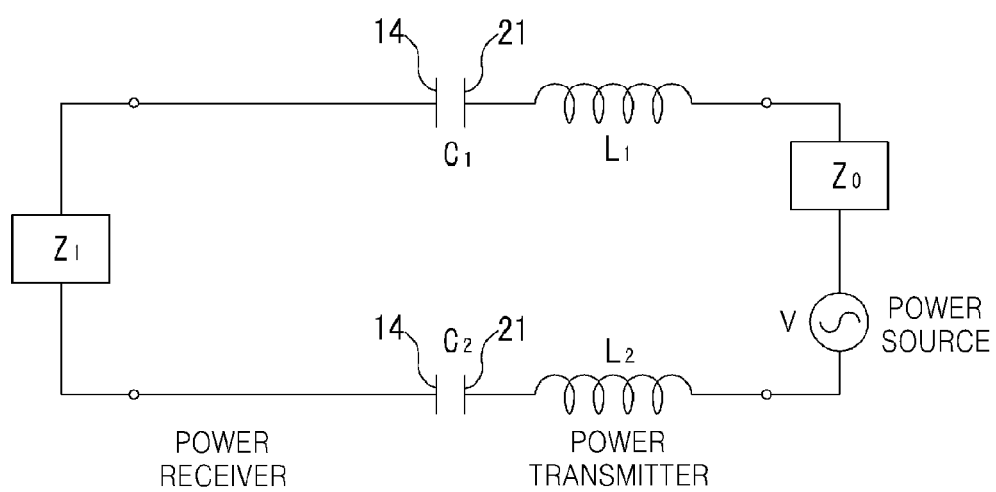
FIG. 4 is a circuit diagram equivalent to the structure of FIG. 3.

In FIGS. 3 and 4, the X-direction beam 20 is the power transmission side, and the mounting head 10 is the power reception side. That is, a power transmitter is installed to the X-direction beam 20 and a power receiver is installed to the mounting head 10. A power transmitter electrode 21 is installed to the power transmitter installed to the X-direction beam 20 and a power receiver electrode 14 is installed to the mounting head 10. Power transmitter electrode 21 is installed to protrude vertically (in a Z-direction as shown in FIG. 3) from top and bottom surfaces of the X-direction beam 20, and the power receiver electrode 14 is installed to protrude vertically (in the Z-direction as shown in FIG. 3) from top and bottom surfaces of the board plate 12 of the mounting head 10 so as to face the power transmitter electrode 21 in a Y-direction as shown in FIG. 3. An equivalent circuit of the power transmission system of FIG. 3 is shown in FIG. 4. Referring to FIG. 3 and FIG. 4, in order to drive mounting head 10, power is transmitted from the power transmitter to the power receiver according to the electric field coupling between the power transmitter electrode 21 and the power receiver electrode 14.

FIG. 4 illustrates capacitance $C_1$ and $C_2$ formed between the power transmitter electrode 21 of the X-direction beam 20 and the power receiver electrode 14 of the mounting head 10. The X-direction beam 20 includes a power transmitter, a pair of inductors $L_1$ and $L_2$ along with a power source V and impedance $Z_0$. One the other hand, the mounting head 10 includes the power receiver and impedance $Z_1$.

Since the mounting head 10 moves in the X-direction while always maintaining a uniform distance from the X-direction beam 20 as described above, a distance between the power transmitter electrode 21 and the power receiver electrode 14 is always constant and may be easily kept to be a minimal distance. The constant and minimal distance may be suitable for transmitting power by using the electric field coupling.

Figure 5:
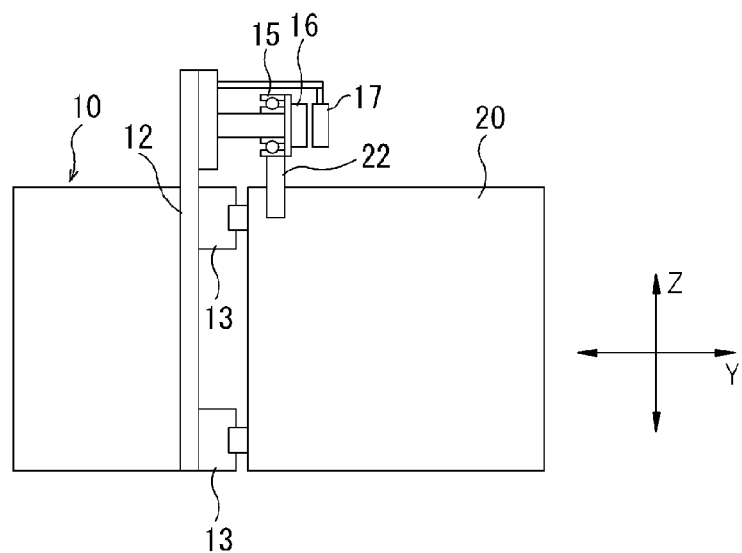
FIG. 5 is a side view illustrating a structure for supplying power to the mounting head in the electronic component mounting apparatus of FIG. 2 according to another exemplary embodiment.

FIG. 5 is a diagram illustrating a structure for supplying power to the mounting head 10, according to another exemplary embodiment. In FIG. 5, electromagnetic induction is used to supply power to the mounting head 10. A power transmission coil is installed to a power transmission side and a power reception coil is installed to a power reception side, and power is transmitted in a non-contact (wireless) manner via electromagnetic induction.

In FIG. 5, the mounting head 10 is installed to the X-direction beam 20 along the length direction (X-direction)

by using the linear guide 13 installed to the board plate 12, and is movable in an X-direction along X-direction beam 20.

In FIG. 5, a power supply rail 22 is installed along the length direction of the X-direction beam 20, as a power transmitter. Power is supplied to the power supply rail 22, and a roller 15 moves in the X-direction in synch with movement of the board plate 12. As roller 15 moves in the X-direction, roller 15 is rotated while maintaining electrical contact with the power supply rail 22. A power transmission coil 16 is installed to the roller 15, and a power reception coil 17 is disposed at a location facing the power transmission coil 16. The power reception coil 17 is installed to the board plate 12 of the mounting head 10, and power generated via electromagnetic induction with the power transmission coil 16 is supplied to the mounting head 10.

As shown in FIG. 3 and FIG. 5, a power transmitter (the power transmitter electrode 21 and the power supply rail 22) is installed to the X-direction beam 20. A power receiver (the power receiver electrode 14 and the power reception coil 17) that receives power in a non-contact (wireless) manner from the power transmitter is installed to the mounting head 10, and the power received is used to drive the mounting head 10. Power may thus be supplied to the mounting head 10 without having to install a direct power feeder.

In addition to power, vacuum suction and compressed air need to be supplied to the mounting head 10 in order to pick up an electronic component and then mount the electronic component on a printed circuit board. In other words, the nozzle 11 of the mounting head 10 uses vacuum suction to pick up the electronic component, and a small amount of compressed air is blown to break the vacuum suction so that the electronic component may be mounted. In an electronic component mounting apparatus of the related art, a negative pressure generating unit for supplying the vacuum suction and a positive pressure generating unit for supplying the compressed air are generally installed external to the mounting head 10, and the positive pressure generating unit and the negative pressure generating unit are each connected to the mounting head 10 through an air pipe.

Similarly, a supplied signal is required to control the mounting head 10. The signal may be supplied via wires in the related art electronic component mounting apparatus, and a control unit and the mounting head 10 are connected via a signal cable. Like a power supply cable, the air pipe and the signal cable are connected to the mounting head 10 by using the Cableveyor™ 210 of FIG. 1. Accordingly, the air pipe and the signal cable should be removed so as not to use the Cableveyor™ 210.

The signal cable may be removed by installing a wireless communication unit in the mounting head 10. Wireless communication is a well known technology, and thus details thereof are not described herein.

The air pipe may be removed by installing a positive pressure generating unit and a negative pressure generating unit inside the mounting head 10.

Figure 6:
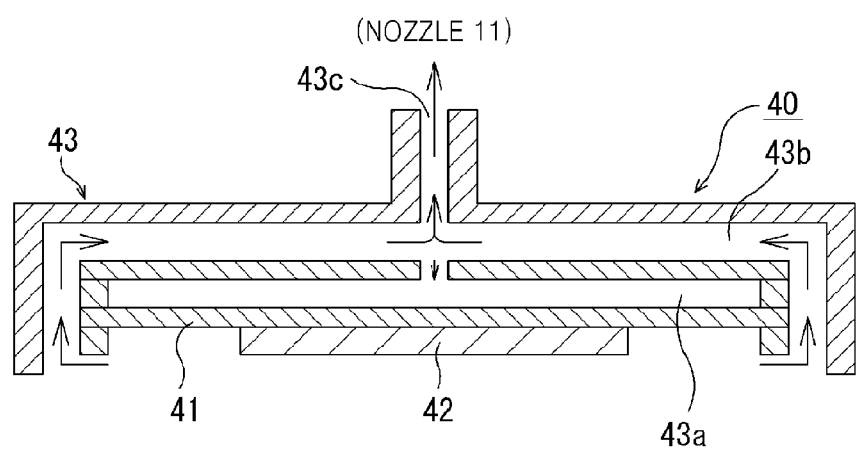
FIG. 6 is a cross-sectional view of a positive pressure generating unit according to an exemplary embodiment.

The positive pressure generating unit may be a micro blower 40 shown in FIG. 6. The micro blower 40 of FIG. 6 includes a vibration plate 41 formed of a flexible film or a flexible thin plate, a piezoelectric element 42 installed to the vibration plate 41, and a structure 43 forming an air chamber 43a and an air inflow chamber 43b with the vibration plate 41.

When the vibration plate 41 is vibrated by the piezoelectric element 42, air in the air inflow chamber 43b is discharged from a discharge unit 43c of the structure 43, with and by air being due to continuously discharged air from the air chamber 43a. By supplying the air discharged from the discharge unit 43c to each nozzle 11 of the mounting head 10, vacuum suction of the nozzle 11 may be broken.

Figure 7:
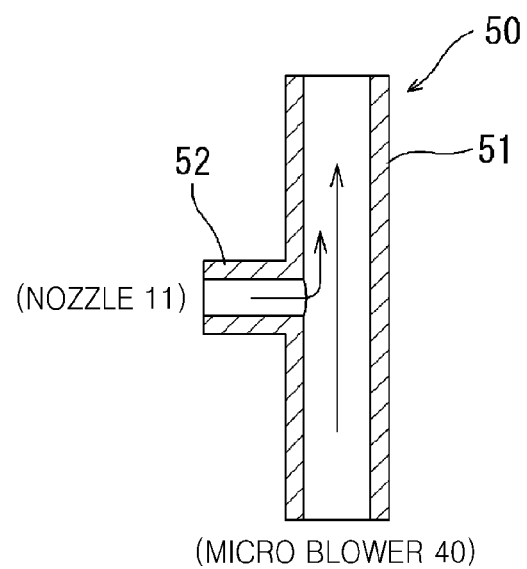
FIG. 7 is a cross-sectional view of a negative pressure generating unit according to an exemplary embodiment.

Meanwhile, the negative pressure generating unit may be formed by using the micro blower 40 described above. An exemplary embodiment of the micro blower 40 is shown in FIG. 7. A negative pressure generating unit 50 shown in FIG. 7 includes a straight main conduit 51 and a branch conduit 52. One end of the straight main conduit 51 is connected to the discharge unit 43c of the micro blower 40 of FIG. 6, and the other end is open to air. The branch conduit 52 branches from the straight main conduit 51 at a right angle and is connected to each nozzle 11 of the mounting head 10. When air that is discharged from the micro blower 40 moves inside the straight main conduit 51, pressure formed inside of the straight main conduit 51 turns negative according to flow speed of the air, and thus pressure inside the branch conduit 52 turns negative. Accordingly, it is possible to supply negative pressure to the nozzle 11.

The micro blower 40 of the current exemplary embodiment has dimensions of 20 mm in length, 20 mm in width, and 2 mm in thickness (when excluding the discharge unit 43c). Thus, the micro blower 40 can be installed inside of the mounting head 10. The small size of micro blower 40, having air discharge pressure of about 1900 Pa and air volume of about 1 L per minute, allows the micro blower 40 to operate as both the positive pressure generating unit and the negative pressure generating unit in the current exemplary embodiment.

As described above, using a non-contact (wireless) power feeder removes the need for a Cableveyor™ 210 when installing the plurality of mounting heads 10 on the X-direction beam 20 as shown in FIG. 2.

The exemplary embodiment is not limited to an electronic component mounting apparatus 1 and may be applied to any working machine inclusive of a working head moving along a guide beam, such as, for example, a welding apparatus inclusive of a welding head moving along a guide beam.

According to one or more exemplary embodiments, since power is transmitted in a non-contact manner, power may be supplied to the working head without abrasion or disconnection. In the case of a plurality of working heads mounted on one guide beam, power feeders will not interfere with one another.

While exemplary embodiments have been particularly shown and described above, it will be understood by those of ordinary skill in the art that various changes in form and details may be made therein without departing from the spirit and scope of the inventive concept as defined by the following claims.

What is claimed is:

1. A working machine comprising:
   a guide beam;
   a power transmitter provided on the guide beam;
   at least one working head configured to move along the guide beam; and
   a power receiver provided on the at least one working head,
   wherein the power receiver receives power from the power transmitter in a non-contact manner in which the power receiver and the power transmitter are not physically connected, and
   wherein the at least one working head is configured to operate by the received power in the non-contact manner.

2. The working machine of claim 1, wherein the at least one working head is configured to move in a direction along an extension direction of the guide beam and maintains a uniform distance from the guide beam in a direction perpendicular from the extension direction.

3. The working machine of claim 1, wherein the non-contact manner comprises electric field coupling,
   wherein the power transmitter comprises a power transmitter electrode, and
   wherein the power receiver comprises a power receiver electrode facing the power transmitter electrode.

4. The working machine of claim 3, wherein the power receiver electrode maintains a uniform distance from the power transmitter electrode in a direction perpendicular to an extension direction of the guide beam.

5. The working machine of claim 1, wherein the non-contact manner comprises electromagnetic induction,
   wherein the power transmitter comprises a power transmission coil, and
   wherein the power receiver comprises a power reception coil facing the power transmission coil.

6. The working machine of claim 5, wherein the power reception coil maintains a uniform distance from the power transmission coil in a direction perpendicular to an extension direction of the guide beam.

7. The working machine of claim 1, wherein the at least one working head comprises a plurality of working heads configured to move along the guide beam.

8. The working machine of claim 1, wherein the working head comprises:
   a wireless communication unit configured to receive a control signal to operate the working head; and
   at least one pressure generating unit.

9. The working machine of claim 1, wherein the power transmitter is fixedly attached to the guide beam.

10. The working machine of claim 1, wherein the power receiver is fixedly attached to the at least one working head.

11. The working machine of claim 1, wherein the at least working head is slidably attached to the guide beam.

12. The working machine of claim 11, wherein the at least working head is slidably attached to the guide beam in a contact manner.

13. The working machine of claim 1, wherein the working machine comprises an electronic component mounting apparatus.

14. The working machine of claim 1, wherein the working head is configured to pick up an electronic component and configured to mount the electronic component onto a substrate.

15. The working machine of claim 1, wherein the guide beam comprises:
   a first guide beam extending in a first direction; and
   a second guide beam extending in a second direction perpendicular to the first direction.

* * * * *